(12) United States Patent
Goezinne

(10) Patent No.: US 6,847,215 B1
(45) Date of Patent: Jan. 25, 2005

(54) ELECTRONIC CIRCUIT FOR DETECTING A CHANGE RELATIVE TO A QUIESCENT CONDITION

(75) Inventor: Jan Goezinne, Zaandijk (NL)

(73) Assignee: Allsym B.V., Delft (NL)

( * ) Notice: Subject to any disclaimer, the term of this patent is extended or adjusted under 35 U.S.C. 154(b) by 171 days.

(21) Appl. No.: 10/048,101
(22) PCT Filed: Jul. 24, 2000
(86) PCT No.: PCT/NL00/00522
§ 371 (c)(1), (2), (4) Date: May 17, 2002
(87) PCT Pub. No.: WO01/08309
PCT Pub. Date: Feb. 1, 2001

(30) Foreign Application Priority Data

Jul. 26, 1999 (NL) .............................................. 1012710

(51) Int. Cl.[7] .......................... G01R 27/28; H03K 17/95
(52) U.S. Cl. ......................................... 324/655; 331/46
(58) Field of Search ................................. 324/606, 633, 324/635, 652, 651, 653, 654, 655, 656; 331/46; 194/318

(56) References Cited

U.S. PATENT DOCUMENTS 4,574,936 A * 3/1986 Klinger ...................... 194/318

* cited by examiner

Primary Examiner—Albert Decady
Assistant Examiner—James Kerveros
(74) Attorney, Agent, or Firm—Michaelson & Associates; Peter L. Michaelson; Janet M. Skafar

(57) ABSTRACT

An electronic circuit for detecting a change with respect to a quiescent condition, which includes an oscillation circuit including a first and a second oscillator circuit, each oscillator circuit includes an oscillator input terminal and an oscillator output terminal on which an oscillation signal is present. The oscillator input of the first oscillator circuit is coupled with the oscillator output of the second oscillator circuit, and the oscillator input of the second oscillator circuit is coupled with the output of the first oscillator circuit. A detection circuit includes a first and a second detection circuit, each circuit further includes a detection input terminal and a detection output terminal on which a detection signal is present, while the detection circuit is arranged for detecting a change between the oscillation signals of the two oscillator circuits as a result of an external influence. The circuit is suitable for applications where otherwise a capacitive, inductive or Hall sensor is used as a proximity switch.

5 Claims, 3 Drawing Sheets

US 6,847,215 B1

ELECTRONIC CIRCUIT FOR DETECTING A CHANGE RELATIVE TO A QUIESCENT CONDITION

BACKGROUND OF THE INVENTION

This invention relates to an electronic circuit for detecting a change with respect to a quiescent condition, in accordance with the preambles of claims 1 and 2.

U.S. Pat. No. 4,574,936 discloses such an electronic circuit in the form of a coin-operated vending machine. For comparing two coins, there is provided an inductive null detector, comprising a symmetric dual feedback oscillator, which is unbalanced when an inserted coin is different from a test coin. The field of application described in this patent specification is limited to comparing coins.

For measuring presence, position or movement of an object, it is known to make use of capacitive sensors, inductive sensors, strain gauges and Hall effect sensors.

For capacitive sensors, it holds that with increasing distance to the electronic measuring circuit having therein the capacitance to be influenced, the applicability decreases as a result of the presence of parasitic capacitance, possibly varying in time.

Existing inductive sensors and inductive proximity switches utilize electrical oscillators, coils, ferrite cores, and the like, while the target material is typically iron, steel, copper or aluminum, and for each target material a different sensitivity applies.

Hall effect sensors are frequently employed, and primarily measure a change of the local magnetic field, which change may be caused by relative movement of the sensor with respect to one or more magnets or other objects.

A common drawback of all these known sensors is that they are suitable only for specific fields of application and often require a complex detection circuit.

There is a need for a simple electronic circuit which can be adapted in a simple manner for a variety of applications which are based on the occurrence of a change in a quiescent condition. To be considered as applications are, for instance, the measurement of a position, of speed, of acceleration of an object, but also layer thickness measurement, determining material properties, hair crack detection, etc. An application of determining a position is the use as analog or digital proximity switch.

BRIEF SUMMARY OF THE INVENTION

The invention contemplates the provision of an electronic circuit which meets this need and to that end provides an electronic circuit for detecting a change with respect to a quiescent condition, as defined in the characterizing parts of claims 1 and 2.

Owing to the circuit according to the invention being symmetrical to a far-reaching extent, it is insensitive to temperature or supply voltage variation. In quiescent condition, given a completely symmetrical structure, there is no voltage difference present between the output terminals.

The invention is based on the principle of the change of the Q factor of one or both oscillator circuits of the electronic detection circuit. The Q factor of an oscillator can be influenced by the change of the capacitance value or of the value of the self-induction of an LC oscillator or by a change of the damping of the oscillator. This gives rise to an asymmetry in the circuit, which leads to different voltages on the output terminals of the detection circuits.

BRIEF DESCRIPTION OF THE DRAWINGS

In the following, the invention will be further explained with reference to the drawing. In the drawing.

DETAILED DESCRIPTION OF THE INVENTION

Figure 1:
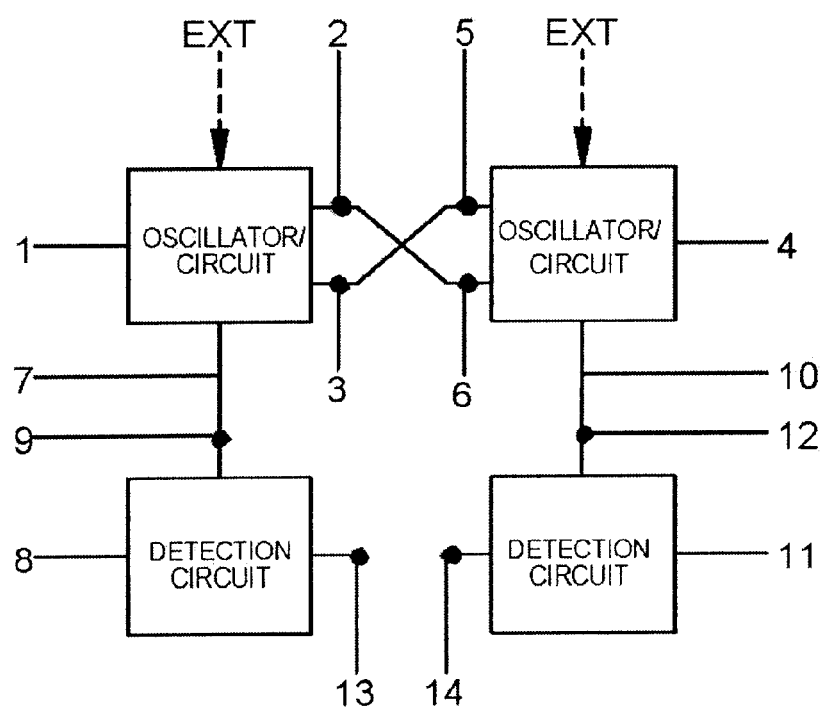
FIG. 1 shows a block diagram of the principle of the invention.

FIG. 1 shows a block diagram of the electronic circuit for detecting a change with respect to a quiescent condition according to the invention. A first oscillator circuit 1 comprises an input 2 and an output 3; a second oscillator circuit 4 comprises an input 5 and an output 6. Further provided are a first detection circuit 8 and a second detection circuit 11. Via a connection 7, the detection circuit 8 receives on the input terminal 9 thereof a signal which is proportional to the output signal of oscillator circuit 1. Via a connection 10, the detection circuit 11 receives on the input terminal 12 thereof a signal which is related, for instance proportional, to the output signal of oscillator circuit 4. The signal difference between the output terminal 13 of the detection circuit 8 and output terminal 14 of the detection circuit 11 is stable in quiescent condition. However, if the Q value of oscillator circuit 2 or of oscillator circuit 4 or of both circuits is varied by an external influence, the signal between the output terminals of the detection circuits 8 and 11 changes. According to the invention, this signal can be utilized for various purposes. The oscillator circuits are preferably second-order harmonic oscillators with complex poles. Such circuits have a low noise level and a high Q factor. As detector, for instance a non-linear electronic component such as a transistor or MOSFET can be used, which detects the envelope of the oscillating voltage. Other possibilities are a switch for synchronous detection of the envelope or a phase detector. A few of these applications in which one or more circuits according to the invention are employed are: a proximity sensor; a phase quadrature sensor for measuring position and speed of a gear wheel or gear rack; a pressure sensor; means for positioning or centering a metal shaft in a hole or a bearing, with preferably four circuits arranged symmetrically around the shaft, etc.

Figure 2:
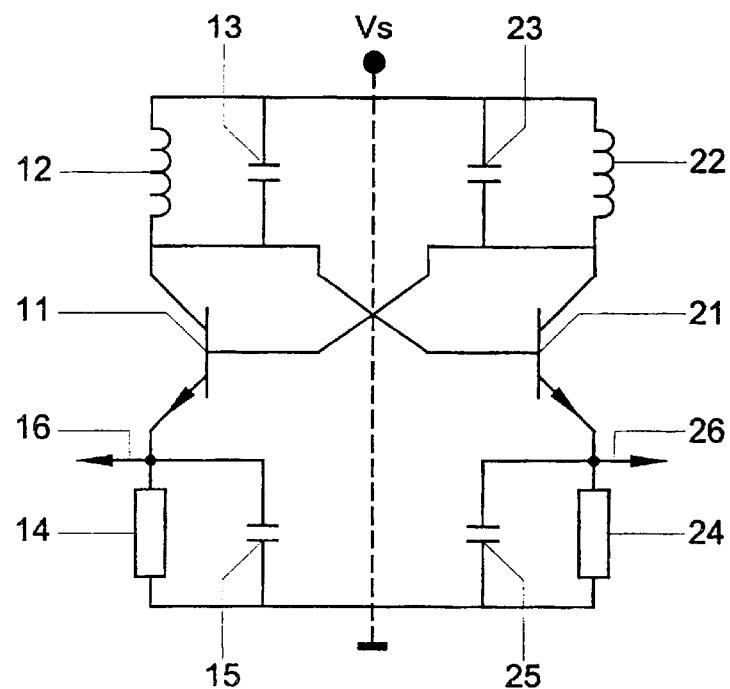
FIG. 2 shows a first embodiment of the electronic circuit according to the invention.

FIG. 2 shows a first exemplary embodiment of the invention. The circuit consists of two parts, which are symmetrical with respect to each other. The line of symmetry is indicated in the figure by a broken line. The parts in the circuitry portion on the left in the figure are designated by the same reference numerals as the parts in the right-hand portion, but the respective numerals in the left-hand portion are preceded by the numeral 1 and those in the right-hand portion by the numeral 2.

The circuitry comprises bipolar transistors 11, 21, which fulfill the functions of both amplifier and detector. In the collector path of each transistor 11, 21 an oscillator circuit is included which consists of parallel connected coils 12, 22 and capacitors 13, 23. In the emitter circuit of each transistor 11, 21, a circuit is included consisting of a parallel connected resistor 14, 24 and capacitor 15, 25. The emitter terminals of the transistors 11, 21 form the two output terminals 16, 26 of the circuitry. The collector of transistor 11, which constitutes the output of the first oscillator circuit, is connected with the base of transistor 21, which constitutes the input of the second oscillator circuit. The collector of transistor 21, which constitutes the output of the second oscillator circuit is connected with the base of transistor 11, which constitutes the input of the first oscillator circuit.

In principle, any of the components 12, 22; 13, 23; 14, 24 and 15, 25, alone or in combination, can form the impedance in the electronic circuit, whose magnitude is varied by means of an external influence to thereby enable a disturbance of the quiescent condition to be detected at the output terminals 16, 26. Preferably, however, either the magnitude of the impedance of one or both self-inductions 12, 22 or the magnitude of one or both capacitances 13, 23 is externally influenced.

Below, a non-exhaustive number of examples will be given of possibilities of externally influencing the self-induction of a coil or the magnitude of a capacitance value: The magnitude of a self-induction can be influenced by:

the presence of a moving electrical conductor in which eddy currents are generated;

the presence of a moving ferromagnetic object;

the mechanical distortion of the self-induction;

changing magnetic properties of material in the vicinity of the self-induction, for instance by subjecting this material to mechanical forces and/or external magnetic fields.

The magnitude of a capacitance can be externally influenced by:

the presence of a moving electrical conductor;

the presence of a moving electrical insulator having particular dielectric properties;

the mechanical distortion of the capacitance;

changing electrical properties of material disposed in the vicinity of the capacitance, for instance by subjecting the material to mechanical forces and/or external magnetic or electrical fields.

Figure 3:
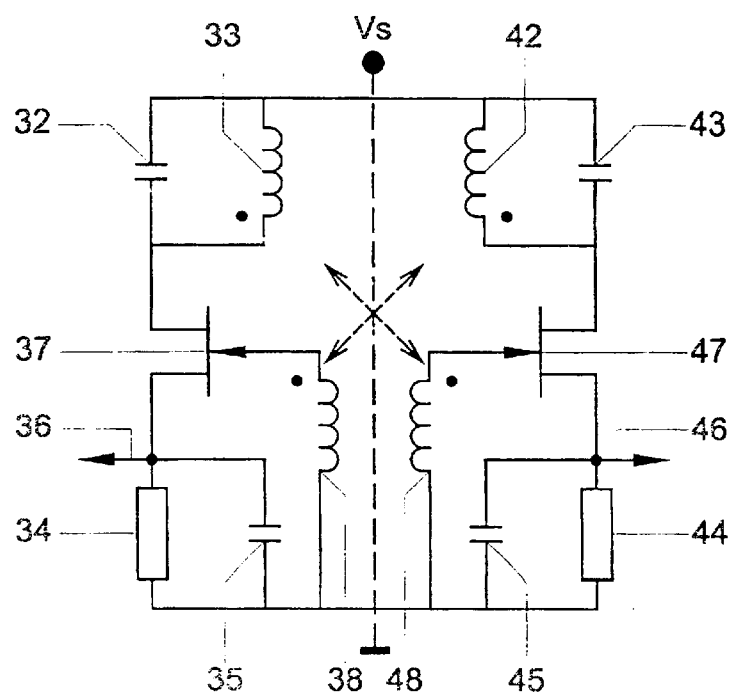
FIG. 3 shows a second embodiment of the electronic circuit according to the invention.

FIG. 3 shows a second exemplary embodiment of the invention. Again, the line of symmetry is indicated, and parts are designated in the same manner as in FIG. 2 and, insofar as identical, also by the same reference numerals, but now preceded by the numeral 3 for the portion on the left in the figure and by the numeral 4 for the portion on the right in the figure. The difference from the embodiment according to FIG. 2 is that the coupling between the two circuit halves is now inductive, and that instead of bipolar transistors, use is made of field effect transistors 37, 47. The inductive coupling is realized by self-inductions 38, 48, which are coupled between the gate of the two FET's 37, 47 and ground. The inductive coupling exists between the self-inductions 38 and 42 and between the self-inductions 48 and 32. The sources of the two FET's form the output terminals of the circuit. External variation of the impedance of one of the components of the circuit according to FIG. 3 can be done in the same manner as in the circuit according to FIG. 2.

Figure 4:
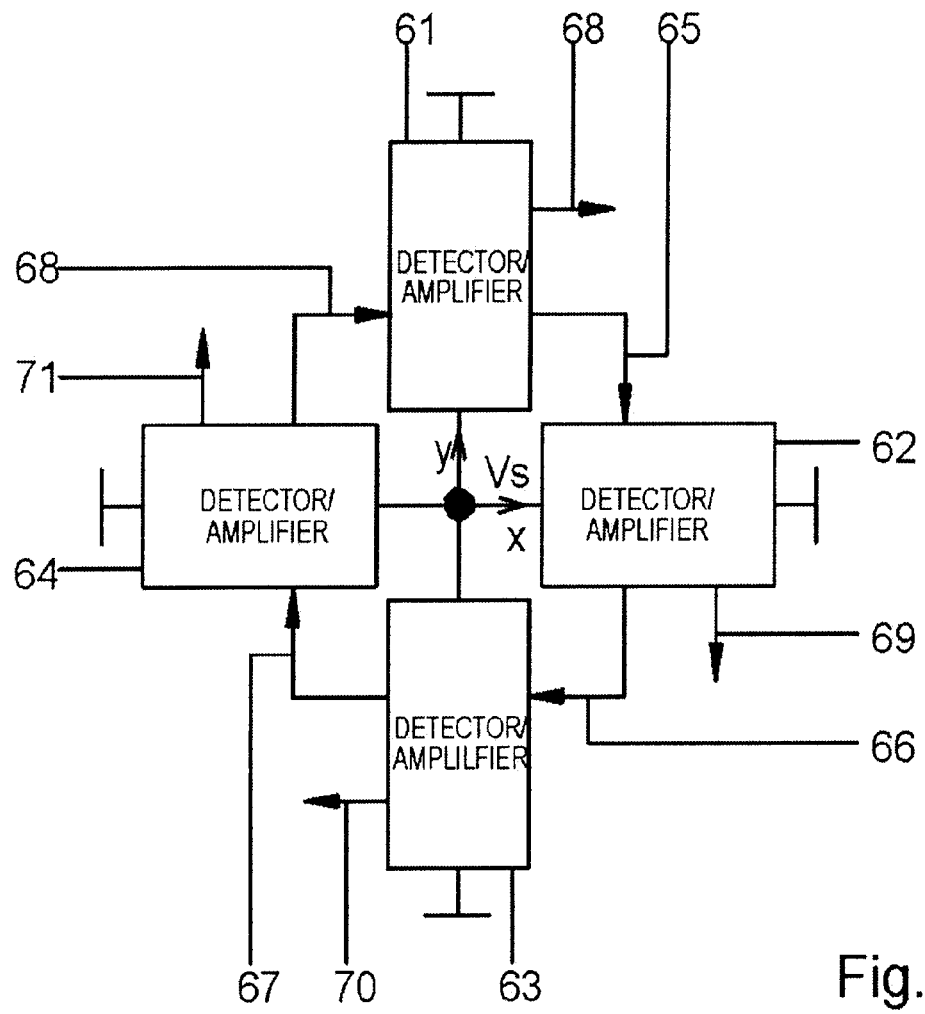
FIG. 4 shows a specific application of the electronic circuit according to the invention.

FIG. 4 shows an application of the invention for measuring a two-dimensional displacement. Four halves of the circuits as shown in FIG. 2 or FIG. 3, are designated by reference numerals 61, 62, 63 and 64 and are mutually coupled, such that in each case the oscillator input of one circuit is coupled with the oscillator output of the preceding circuit. This is indicated by arrows 65, 66, 67 and 68. The output terminals 69, 70, 71 and 72 of the circuits 61, 62, 63 and 64, respectively, give output signals by means of which the position of a metal object $V_s$, which is located centrally between the circuits 61–64, can be accurately determined on the basis of, on the one hand, output signals of the circuits 61 and 63 for variation in the y-direction and, on the other, the output signals of the circuits 62 and 64 for variations in the x-direction. One application is positioning or centering a metal shaft in a hole or in a bearing through a, preferably differential, twofold measurement, with the four circuits arranged symmetrically around the shaft. Another application is the measurement of two set angular positions of a rearview wing mirror for a car, a headlight of a car, and the like, through a twofold, preferably differential measurement, with the four circuits arranged, preferably symmetrically, in a plane around the tilting point of the mechanism. Optionally, one or more metals or ferromagnetic parts are added to enable the reactive movement to be observed.

The circuit according to the invention can be arranged on a single substrate, yielding a compact detector which can be properly protected against undesired external influences. Also temperature influences are then optimally compensated. The circuit according to the invention can further be employed in a similar manner to Hall sensors. The circuit according to the invention can be expanded to include differentiators and/or integrators, which differentiate or integrate one or more output signals. As a result, for instance starting from a position signal, through differentiation a signal representative of speed or acceleration can be obtained.

Other exemplary embodiments are the uses of several LC circuits with a transistor, such as, for instance, transistor 11, where by means of a multiplexer in each case an LC circuit is coupled with the transistor. In this way, in a simple manner, with few extra components, a multipoint measurement can be realized. It is also possible not to allow the oscillators of the circuit to oscillate freely, but to impose a fixed oscillation frequency by means of an external oscillator.

It will be clear to those skilled in the art that within the framework of the invention, a great many other application possibilities are conceivable.

What is claimed is:

1. An electronic circuit for detecting a change with respect to a quiescent condition, which circuit includes oscillation means comprising at least a first and a second oscillator circuit, each circuit comprising an oscillator input terminal and an oscillator output terminal on which an oscillation signal is present, the oscillator input of the first oscillator circuit being coupled with the oscillator output of the second oscillator circuit, and the oscillator input of the second oscillator circuit being coupled with the output of the first oscillator circuit, as well as detection means comprising at least a first and a second detection circuit each detection circuit comprising a detection output terminal on which a detection signal is present, the detection means being arranged for detecting a change between the oscillation signals of the at least two oscillator circuits as a result of an external influencing, the detection and oscillator circuits being substantially symmetrical or identical to each other, the first and second detection circuit forming a part of the first and the second oscillator circuit, respectively, each oscillator circuit comprising at least one bipolar transistor, of which the base forms both the oscillator input terminal, the emitter forms the detection output terminal, in the collector path a resonance circuit being included, with the collector forming the oscillator output terminal.

2. An electronic circuit according to claim 1, wherein n-oscillator circuits and n-detection circuits, with $n \geq 2$, are provided while the oscillator output of oscillator circuit n−1 is coupled with the oscillator input of oscillator circuit n, and the oscillator output of oscillator circuit n is coupled with the oscillator input of oscillator circuit 1.

3. An electronic circuit according to claim 1, wherein the at least two oscillator circuits and the at least two detection circuits are arranged substantially in integrated form on the same substrate.

4. An electronic circuit for detecting a change with respect to a quiescent condition, which circuit includes oscillation means comprising at least a first and a second oscillator circuit, each circuit comprising an oscillator input terminal and an oscillator output terminal on which an oscillation signal is present, the oscillator input of the first oscillator circuit being coupled with the oscillator output of the second oscillator circuit, and the oscillator input of the second oscillator circuit being coupled with the output of the first oscillator circuit, as well as detection means comprising at least a first and a second detection circuit each detection circuit comprising a detection output terminal on which a detection signal is present, the detection means being arranged for detecting a change between the oscillation signals of the at least two oscillator circuits as a result of an external influencing, the detection and oscillator circuits being substantially symmetrical or identical to each other, the first and second detection circuit form forming a part of the first and the second oscillator circuit, respectively, each oscillator circuit comprising at least one field effect transistor, of which the gate forms both the oscillator input terminal, the source forms the detection output terminal, in the drain path a resonance circuit being included, with the drain forming the oscillator output terminal.

5. An electronic circuit according to claim 4, wherein the resonance circuit comprises at least one self-induction, that in the gate circuit of each of the field effect transistors a self-induction is included, and that the coupling between the oscillator output of the first oscillator circuit and the oscillator input of the second oscillator circuit, and between the oscillator output of the second oscillator circuit and the oscillator input of the first oscillator circuit, respectively, is an inductive coupling.

\* \* \* \* \*